United States Patent [19]
Matsui et al.

[11] Patent Number: 5,844,453
[45] Date of Patent: Dec. 1, 1998

[54] SURFACE ACOUSTIC WAVE FILTER UTILIZING A TRANSDUCER HAVING INTERDIGITAL ELECTRODES AND CONTINUOUSLY ADJACENT ELECTRODES

[75] Inventors: Kuniyuki Matsui; Yasuhiro Hirao, both of Osaka; Yasumi Kobayashi, Kyoto; Kousuke Takeuchi, Osaka; Kenichi Shibata, Wakayama, all of Japan

[73] Assignee: Sanyo Electric Co., Ltd., Osaka, Japan

[21] Appl. No.: 654,608

[22] Filed: May 29, 1996

[30]     Foreign Application Priority Data

May 30, 1995  [JP]  Japan ................................. 7-131918
May 29, 1995  [JP]  Japan ................................. 7-129939

[51] Int. Cl.$^6$ ............................. H03H 9/64; H03H 9/25
[52] U.S. Cl. ..................... 333/193; 333/195; 310/313 B
[58] Field of Search ................................ 333/193–196; 310/313 R, 313 B, 313 C, 313 D

[56]          References Cited

U.S. PATENT DOCUMENTS

| 3,792,381 | 2/1974 | Bristol ................................. 333/193 |
| 3,886,504 | 5/1975 | Hartmann et al. ............... 310/313 R X |
| 4,742,319 | 5/1988 | Sone ................................... 333/194 X |
| 5,304,965 | 4/1994 | Männer .......................... 310/313 R X |
| 5,363,074 | 11/1994 | Higgins, Jr. ............................ 333/195 |
| 5,589,806 | 12/1996 | Taguchi et al. ....................... 333/193 |
| 5,600,287 | 2/1997 | Kwan et al. .......................... 333/195 |

FOREIGN PATENT DOCUMENTS

3-270309  12/1991  Japan .
6-188673  7/1994  Japan ................................. 333/193

OTHER PUBLICATIONS

"900 MHz Range Wideband Double Mode SAW Filters," Morita et al., Journal of Institute of Communication Engineering of Japan, A vol., j76–A, No. 2, pp. 227–235, Feb. 1993.

"Development of SAW Bandpass Filters for Portable Telephones Using Weighting for the Number of Finger Pairs", Satoh et al., The Transaction of The Institute of Electrical Engineers of Japan, vol. 111—C, No. 9, pp. 396–403, 1991.

*Primary Examiner*—Robert J. Pascal
*Assistant Examiner*—Barbara Summons
*Attorney, Agent, or Firm*—Armstrong, Westerman, Hattori, McLeland & Naughton

[57]          ABSTRACT

A surface acoustic wave filter according to the present invention has one or a plurality of filter functional units each comprising a series arm resonator and a parallel arm resonator. Each of the series arm resonator and the parallel arm resonator is constituted by a interdigital transducer and grating reflectors formed on a piezoelectric substrate composed of 64°-rotated Y-cut X-propagating LiNbO$_3$. The series arm resonator is constructed by electrically connecting a one-port resonator in series with a signal line, and the parallel arm resonator is constructed by electrically connecting a one-port resonator in parallel with the signal line. In the interdigital transducer in the series arm resonator and/or the parallel arm resonator, one or more sets of electrode fingers continuously adjacent to each other are formed.

5 Claims, 16 Drawing Sheets

SURFACE ACOUSTIC WAVE FILTER UTILIZING A TRANSDUCER HAVING INTERDIGITAL ELECTRODES AND CONTINUOUSLY ADJACENT ELECTRODES

BACKGROUND OF THE INVENTION

1. Field of the Invention

The present invention relates to surface acoustic wave filters used as high-frequency devices.

2. Description of the Related Art

With the recent spread of automobile telephones and portable telephones, the necessity for small-sized, high-performance high-frequency filters is increased. As the high-frequency filters, a dielectric filter and a surface acoustic wave filter are conventionally known. The latter surface acoustic wave filter is suitable for small size and high performance.

Examples of the surface acoustic wave filter include surface acoustic wave filters of an interdigitated interdigital transducer type, a multiple-mode type, and a composite-type (a ladder connection type). Each of the surface acoustic wave filters can realize a band-pass filter at a frequency of not less than 800 MHz. The composite-type surface acoustic wave filter has been paid attention to in that it has a low loss and it requires no matching circuit.

In the composite type surface acoustic wave filter, two one-port resonators 22 each formed by an interdigital transducer 22a and grating reflectors 22b on a piezoelectric substrate (e.g., LiNbO$_3$) 21 constitute one filter functional unit 23, as shown in FIG. 13. One of the one-port resonators 22 is electrically connected in series with a signal line 24 (this is referred to as a series arm resonator 22S), and the other one-port resonator 22 is electrically connected in parallel with the signal line 24 (this is referred to as a parallel arm resonator 22P). FIG. 14 illustrates the basic construction of the filter functional unit 23.

The composite type surface acoustic wave filter realizes a band-pass filter utilizing the difference in impedance between the series arm resonator 22S and the parallel arm resonator 22P. The principle will be briefly described with reference to FIGS. 15A and 15B. Let jXs be the impedance of the series arm resonator 22S, jXp be the impedance of the parallel arm resonator 22P, $f_{ap}$ be the antiresonance frequency of the parallel arm resonator 22P and $f_{rp}$ be the resonance frequency thereof, and $f_{as}$ be the antiresonance frequency of the series arm resonator 22S and $f_{rs}$ be the resonance frequency thereof. In this case, the antiresonance frequency $f_{ap}$ and the resonance frequency $f_{rs}$ are made approximately equal to each other, as shown in FIG. 15A, whereby filter characteristics taking the antiresonance frequency $f_{as}$ and the resonance frequency $f_{rp}$ as poles centered around the approximately equal frequencies are obtained, as shown in FIG. 15B.

The number of resonators 22 is set on the basis of the insertion loss, the attenuation outside the band, and the like of the filter. If 36°-rotated Y-cut X-propagating LiTaO$_3$ is used as a piezoelectric substrate 21 in such a construction that filter functional units 23 in three stages are provided using three series-arm resonators 22S and three parallel-arm resonators 22P, a low-loss filter having a minimum insertion loss of not more than 2 dB and having attenuation outside the band of not less than 25 dB in a frequency band of 800 MHz is obtained. In this construction, the impedance of the series-arm resonator 22S is zero and the impedance of the parallel-arm resonator 22P is sufficiently more than 50 Ω in the passband, whereby impedance matching is achieved, and no matching circuit is required.

In the composite-type surface acoustic wave filter, the degree of freedom for changing the band width is low from its filter principle. Specifically, it is important to make the resonance frequency $f_{rs}$ of the series arm resonator 22S and the antiresonance frequency $f_{ap}$ of the parallel arm resonator 22P approximately equal to each other. If an attempt is made to obtain a filter having a large band-width without making the resonance frequency $f_{rs}$ and the antiresonance frequency $f_{ap}$ approximately equal to each other, the difference in the resonance frequencies $\Delta f$ ($f_{rs}-f_{rp}$) must be increased, as shown in FIGS. 16A and 16B. In this case, the deviation between the antiresonance frequency $f_{ap}$ and the resonance frequency $f_{rs}$ causes a ripple in the band. When the difference in the resonance frequencies $\Delta f$ is decreased, as shown in FIGS. 17A and 17B, the passband is brought into a convex shape.

In order to change the band-width while obtaining proper filtering characteristics, therefore, the difference between the resonance frequency and the antiresonance frequency of each of the resonators 22 must be changed. One method of changing the difference in frequencies includes a method of changing the electromechanical coupling factor of the piezo-electric substrate 21. This method utilizes the fact that the difference between the resonance frequency and the anti-resonance frequency of the resonator 22 is increased if the electromechanical coupling factor is increased, while being decreased if the electromechanical coupling factor is decreased. Therefore, a substrate having a large electromechanical coupling factor may be used when a filter having a large band-width is required, while a substrate having a small electromechanical coupling factor may be used when a filter having a small band-width is required.

In the conventional method of changing the difference in frequencies by changing a substrate, however, the following problem occurs. That is, as a piezoelectric substrate used for a high-frequency filter having a frequency of not less than 800 MHz, only two types of substrates, i.e., 36°-rotated Y-cut X-propagating LiTaO$_3$ (electromechanical coupling factor $k^2=0.047$) and 64°-rotated Y-cut X-propagating LiNbO$_3$ (electromechanical coupling factor $k^2=0.11$) are useful. Therefore, it is difficult to realize a filter sufficiently coping with a frequency band-width (e.g., 33 MHz, 25 MHz, 17 MHz) required in each communication method.

An object of the present invention is to provide a surface acoustic wave filter whose degree of freedom in design is high in terms of band-width.

As an interdigitated interdigital transducer type filter in which a plurality of input and output electrodes are arranged on the same propagation path, techniques disclosed in Transactions of The Institute of Electrical Engineers of Japan, 111-C, 9, pp.396–403 and Japanese Patent Laid-Open Gazette No. 270309/1991 are known. As a modecoupling type filter utilizing modecoupling of a surface acoustic wave resonator, techniques disclosed in Journal of Institute of Communication Engineering of Japan, A Vol. j76-A No. 2, pp.227–235 93/2 are known. The modecoupling type filter has frequency-attenuation characteristics as shown in FIG. 18. When the surface acoustic wave filter is used as a band-pass filter, examples of required characteristics include a passband width, an insertion loss, and attenuation outside the band. Further, in a high-frequency filter, it is desired to reduce the insertion loss to the utmost.

Another object of the present invention is to provide an interdigitated interdigital transducer type surface acoustic wave filter having a reduced insertion loss.

SUMMARY OF THE INVENTION

A surface acoustic wave filter according to the present invention has one or more filter functional units each comprising a series arm resonator and a parallel arm resonator. Each of the series arm resonator and the parallel arm resonator is formed by a interdigital transducer and grating reflectors formed on a piezoelectric substrate. The series arm resonator is electrically connected in series with a signal line, and the parallel arm resonator is electrically connected in parallel with the signal line. The interdigital transducer in the series arm resonator and/or the parallel arm resonator has one or more sets of electrode fingers continuously adjacent each other.

The interdigital transducer comprising continuously adjacent electrode fingers corresponds to an interdigital transducer comprising a plurality of interdigital transducers on both sides of the adjacent electrode fingers. In a resonator comprising a plurality of interdigital transducers, the frequencies at the resonance point and the antiresonance point thereof vary depending on the number of interdigital transducers. That is, the resonance point and the antiresonance point of the resonator can be arbitrarily varied. In a surface acoustic wave filter constructed by constituting a filter functional unit by a resonator having such arbitrary resonance and antiresonance points, therefore, the passband width can be arbitrarily set.

In a surface acoustic wave filter constructed by providing a pair of grating reflectors on a piezoelectric substrate and arranging at least one input electrode and at least one output electrode between the grating reflectors, to form one interdigitated interdigital transducer type surface acoustic wave filter structure, the surface acoustic wave filter according to the present invention is characterized in that the distance L between electrode fingers respectively positioned at the outermost ends of the input electrode and the output electrode and opposite to each other is set to a value represented by $L=(0.5n+d)\lambda$ in the range of $0.35 \leq d \leq 0.58$, letting $\lambda$ be the wavelength of a surface acoustic wave and n be an integer.

The distance L between the electrode fingers is set as described above, whereby the insertion loss of the filter is reduced. In addition, the filter passband is narrowed. When a narrow band is required as the filter passband, and a low insertion loss is required, therefore, the surface acoustic wave filter of this construction exhibits superior characteristics.

In a surface acoustic wave filter constructed by providing a plurality of pairs of grating reflectors on one piezoelectric substrate and arranging at least one input electrode and at least one output electrode between the grating reflectors in each of the pairs, to form a plurality of interdigitated interdigital transducer type surface acoustic wave filter structures, and connecting the surface acoustic wave filter structures in series with each other, the surface acoustic wave filter according to the present invention is characterized in that the distance L between electrode fingers respectively positioned at the outermost ends of the input electrode and the output electrode and opposite each other is set to a value represented by $L=(0.5n+d)\lambda$ in the range of $0.35 \leq d \leq 0.58$, letting $\lambda$ be the wavelength of a surface acoustic wave and n be an integer.

In such construction, the filter passband is further narrowed, and the insertion loss is increased. However, this construction is suitable for a case where a narrower band is required as the filter passband. In addition, the insertion loss is held lower, as compared with that in a case where conventional interdigitated interdigital transducer type surface acoustic wave filters are connected in series. Furthermore, attenuation outside the band which is greater than that of the interdigitated interdigital transducer type surface acoustic wave filter comprising only one surface acoustic wave filter structure is obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A first embodiment of a surface acoustic wave filter according to the present invention will be described on the basis of the drawings.

Figure 1:
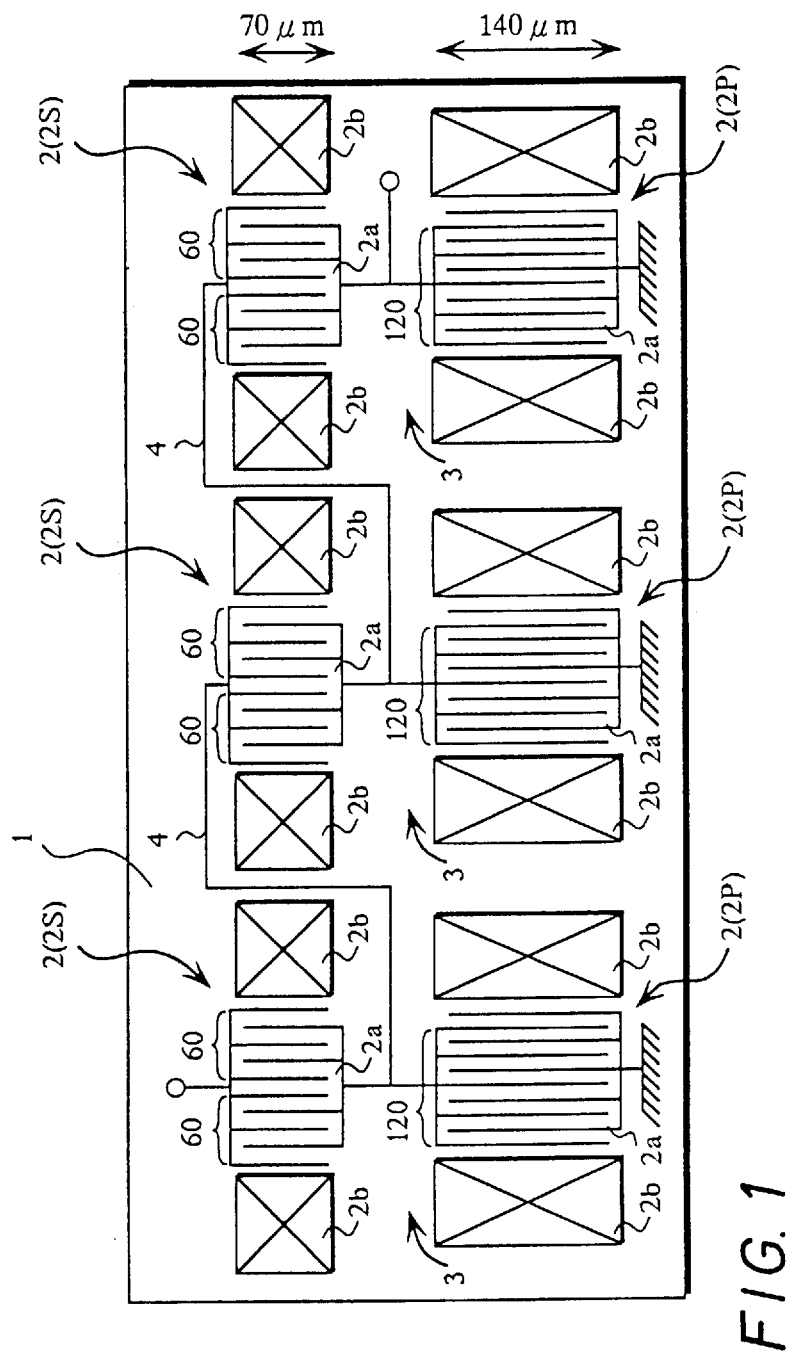
FIG. 1 is a typical plan view showing a composite type surface acoustic wave filter according to the present invention.

FIG. 1 is a typical plan view showing a composite type (ladder connection type) surface acoustic wave filter according to the present invention. The surface acoustic wave filter has three filter functional units 3 each comprising a series arm resonator 2S and a parallel arm resonator 2P. Each of the series arm resonator 2S and the parallel arm resonator 2P is formed by an interdigital transducer 2a and grating reflectors 2b formed on a piezoelectric substrate 1 composed of 64°-rotated Y-cut X-propagating $LiNbO_3$. The series arm resonator 2S is constructed by electrically connecting a one-port resonator 2 in series with a signal line 4, and the parallel arm resonator 2P is constructed by electrically connecting a one-port resonator 2 in parallel with the signal line 4.

In the surface acoustic wave filter shown in FIG. 1, the center frequency $f_0$ in the passband is set to 902.5 MHz, the band-width is set to 25 MHz, the number of electrode fingers of the interdigital transducer 2a in the series arm resonator 2S and the number of electrode fingers of the interdigital transducer 2a in the parallel arm resonator 2P are respectively set to 120, and the length of the electrode fingers of the interdigital transducer 2a in the series arm resonator 2S (the opening length) is set to 70 μm, and the length of the electrode fingers of the interdigital transducer 2a in the parallel arm resonator 2P (the opening length) is set to 140 μm.

In the interdigital transducer 2a in the series arm resonator 2S, a set of electrode fingers continuously adjacent to each other is formed.

Figure 2:
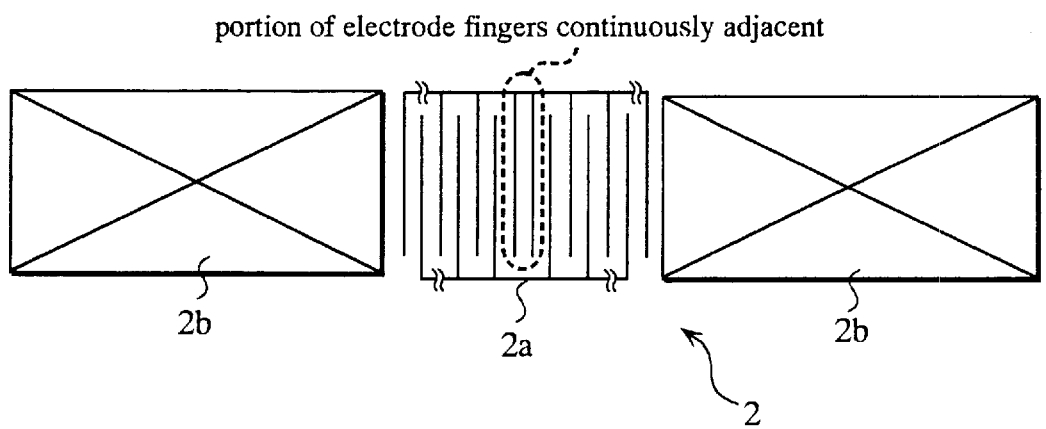
FIG. 2 is a typical enlarged plan view showing a series arm resonator in the surface acoustic wave filter shown in FIG. 1.

FIG. 2 is a typical enlarged plan view showing the interdigital transducer 2a in the series arm resonator 2S in the surface acoustic wave filter shown in FIG. 1. In FIG. 2, electrode fingers continuously adjacent to each other are enclosed by a dotted line. The number of electrode fingers of the interdigital transducer 2a in the series arm resonator 2S is 120, as described above. Sixty electrode fingers respectively exist on both sides of the set of continuously adjacent electrode fingers.

Figure 3:
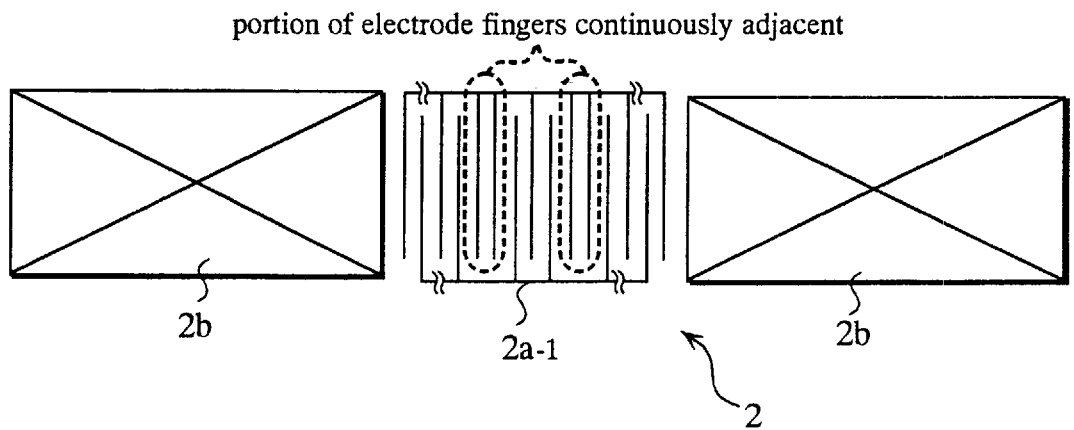
FIG. 3 is a typical plan view showing a modified example (division into three parts) of the resonator according to the present invention.

FIG. 3 is a typical enlarged plan view showing a modified example of the interdigital transducer $2a_{-1}$ in the series arm resonator 2S, similarly to FIG. 2. In the interdigital transducer $2a_{-1}$ shown in FIG. 3, two sets of electrode fingers continuously adjacent to each other are formed. The number of electrode fingers of the interdigital transducer $2a_{-1}$ shown in FIG. 3 is 120, as described above. Forty electrode fingers respectively exist on both sides of the set of continuously adjacent electrode fingers.

Figure 4:
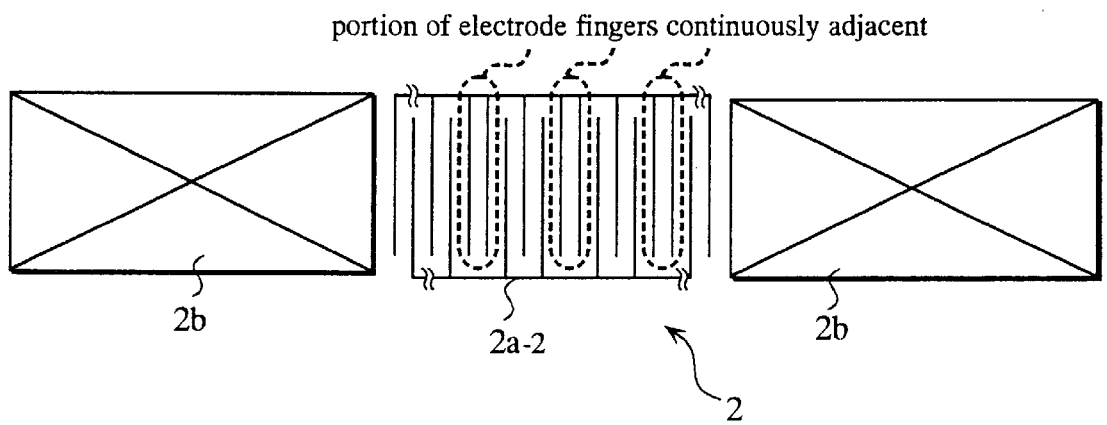
FIG. 4 is a typical plan view showing a modified example (division into four parts) of the resonator according to the present invention.

FIG. 4 is also a typical enlarged plan view showing a modified example of the interdigital transducer $2a_{-2}$ in the series arm resonator 2S, similarly to FIG. 2. In the interdigital transducer $2a_{-2}$ shown in FIG. 4, three sets of electrode fingers continuously adjacent to each other are formed. The number of electrode fingers of the interdigital transducer $2a_{-2}$ shown in FIG. 4 is 120, as described above. Thirty electrode fingers respectively exist on both sides of the set of continuously adjacent electrode fingers.

Figure 5:
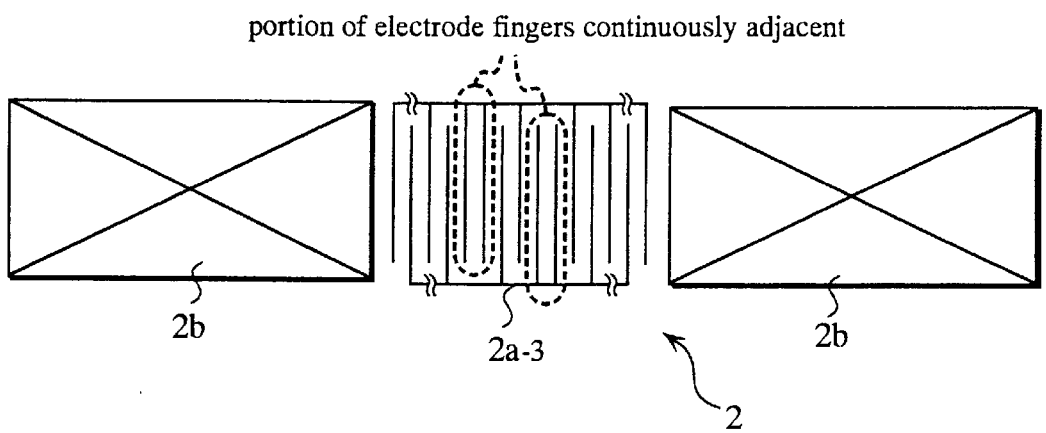
FIG. 5 is a typical plan view showing a modified example (division into three parts) of the resonator according to the present invention.

FIG. 5 is also a typical enlarged plan view showing a modified example of the interdigital transducer $2a_{-3}$ in the series arm resonator 2S, similarly to FIG. 2. In the interdigital transducer $2a_{-3}$ shown in FIG. 4, two sets of electrode fingers continuously adjacent to each other are formed. One of the sets of continuously adjacent electrode fingers is formed on the side of one of comb-shaped electrodes constituting the interdigital transducer $2a_{-3}$, and the other set of continuously adjacent electrode fingers is formed on the side of the other one of the comb-shaped electrodes constituting the interdigital transducer $2a_{-3}$, so that the positions where the two sets of continuously adjacent electrode fingers are formed are not overlapped with each other.

As in the above-mentioned FIGS. 2 to 5, the interdigital transducer $2a(2a_{-1}, 2a_{-2}, 2a_{-3})$ comprising the continuously adjacent electrode fingers corresponds to an interdigital transducer comprising a plurality of interdigital transducers on both sides of the adjacent electrode fingers. That is, the interdigital transducer 2a is an interdigital transducer divided into two parts in FIG. 2, an interdigital transducer divided into three parts in FIGS. 3 and 5, and an interdigital transducer divided into four parts in FIG. 4. In a resonator comprising a plurality of interdigital transducers (divided interdigital transducers), the frequencies at the resonance point and the antiresonance point vary depending on the number of interdigital transducers (the number of divisions).

Figure 6:
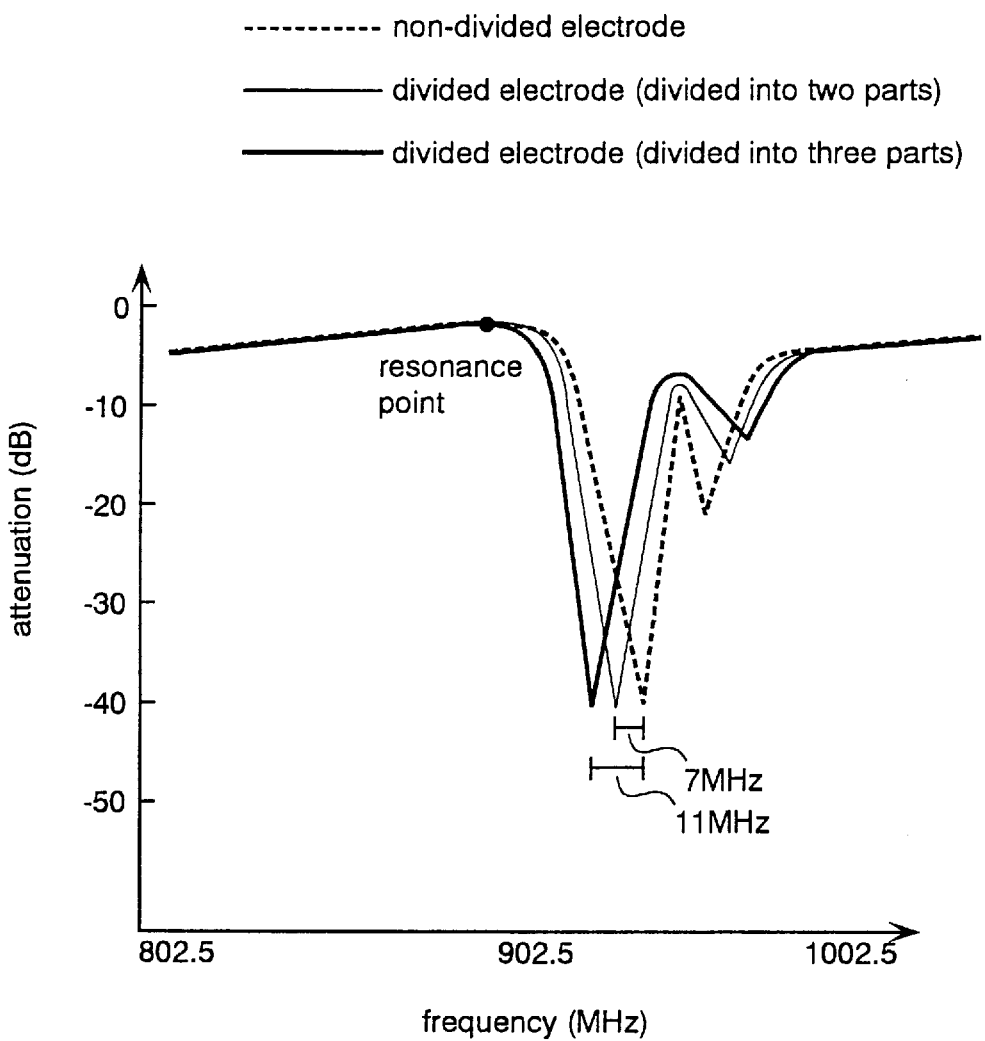
FIG. 6 is a graph showing frequency-attenuation characteristics in resonators (divided type) according to the present invention and a conventional resonator (non-divided type)

FIG. 6 is a graph showing frequency-attenuation characteristics in the resonator 2, which illustrates three interdigital transducers,. i.e., the interdigital transducer of the construction shown in FIG. 2 (which is indicated by a thin line. as one divided into two parts), the interdigital transducer of the construction shown in FIG. 3 (which is indicated by a thick line as one divided into three parts), and the interdigital transducer of a non-divided type (a conventional type).

As is apparent from FIG. 6, the spacing between the most attenuated point (the antiresonance point) and the resonance point in the resonator having the interdigital transducer divided into two parts is made narrower by 7 MHz than the spacing between the antiresonance point and the resonance point of the resonator having the conventional interdigital transducer. The spacing between the antiresonance point and the resonance point of the resonator having the interdigital transducer divided into three parts is made narrower by 11 MHz than spacing between the antiresonance point and the resonance point of the resonator having the conventional interdigital transducer.

Specifically, in the resonator 2 having the divided interdigital transducer 2a, the resonance point and the antiresonance point of the resonator 2 can be arbitrarily varied depending on the number of divisions. In a surface acoustic wave filter according to the present invention constructed by constituting a filter functional unit by a resonator having arbitrary resonance and antiresonance points, therefore, the passband width can be arbitrarily set.

Figure 7:
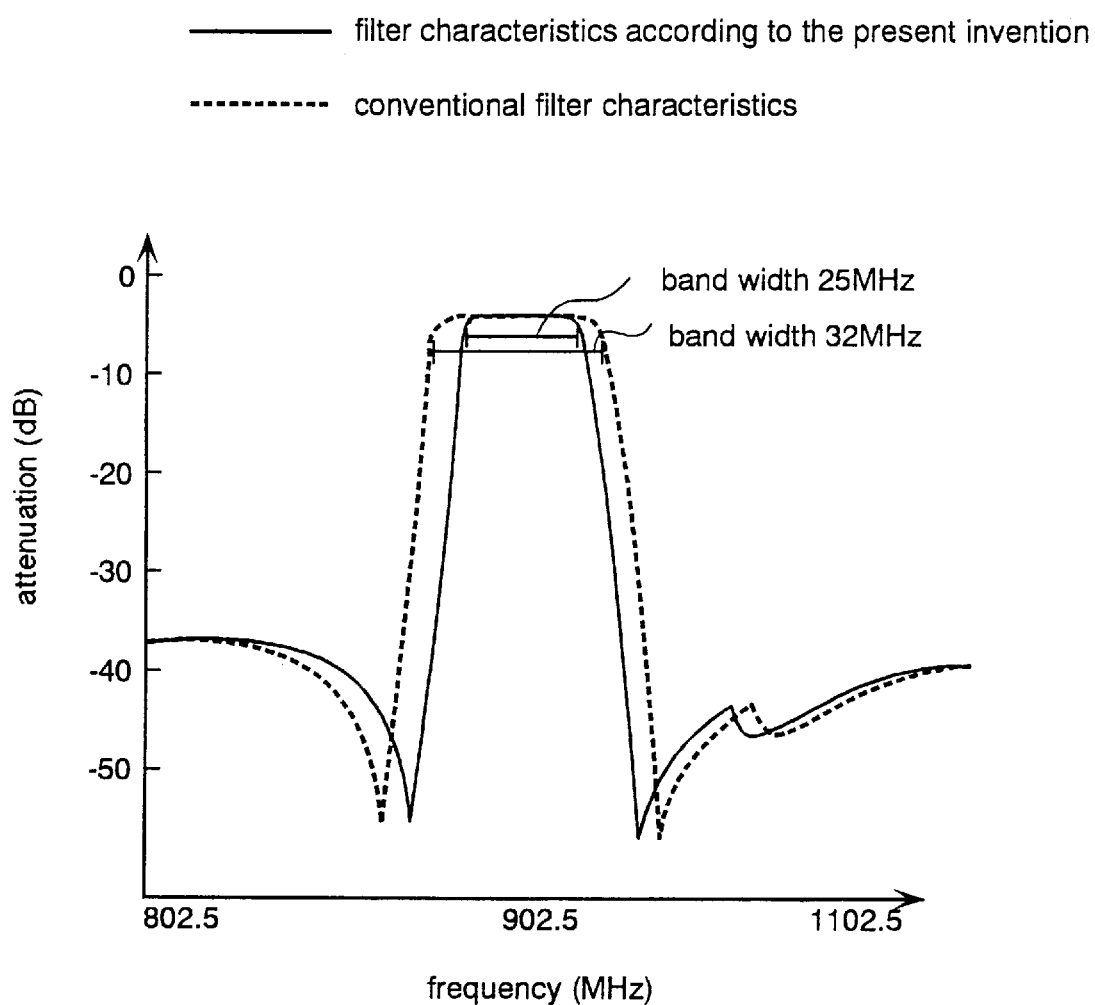
FIG. 7 is a graph showing frequency-attenuation characteristics in a surface acoustic wave filter according to the present invention and a conventional surface acoustic wave filter.
Figure 13:
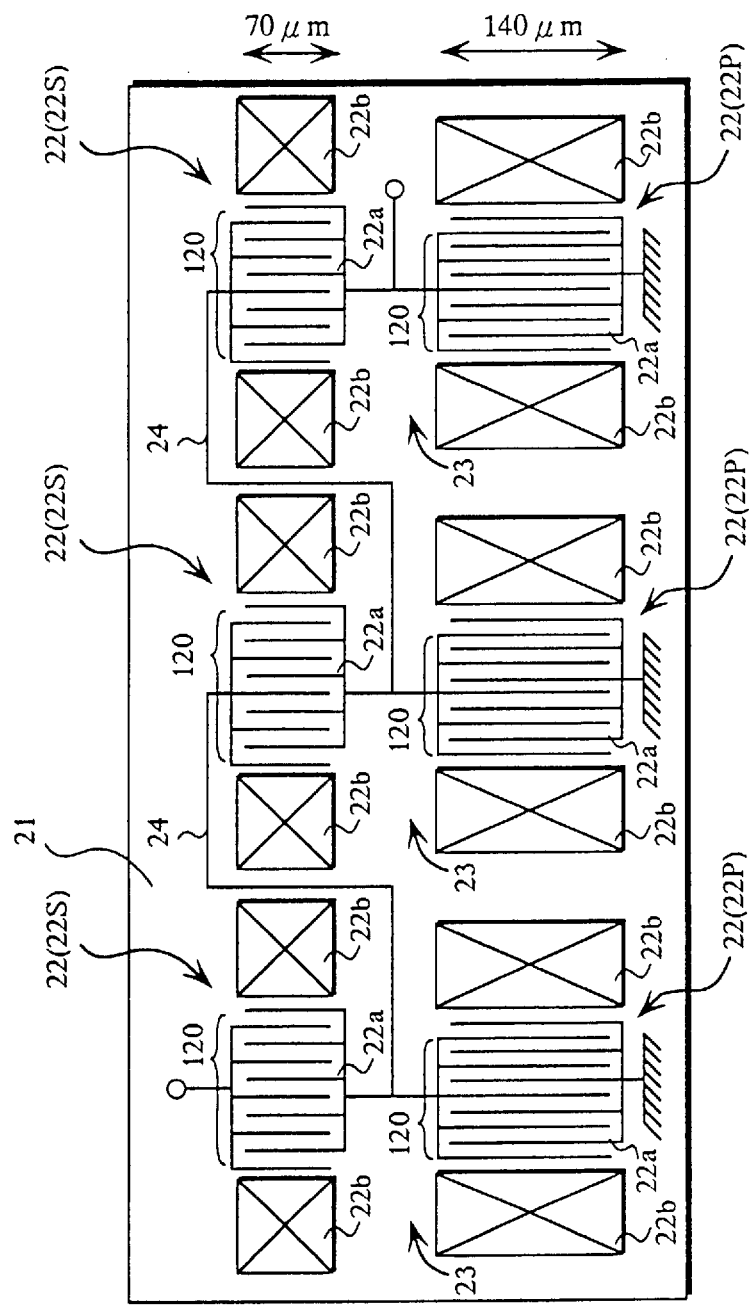
FIG. 13 is a typical plan view showing a conventional composite type surface acoustic wave filter.
Figure 14:
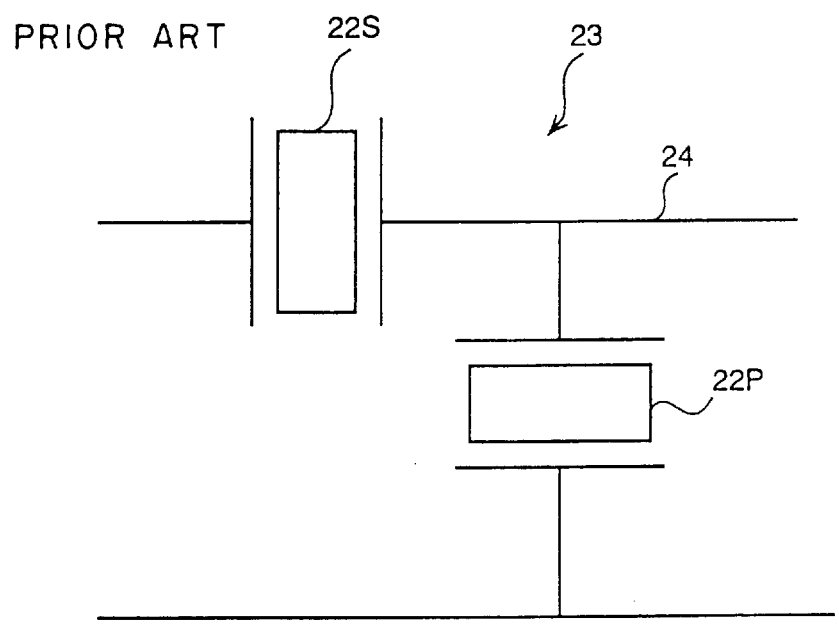
FIG. 14 is a typical plan view showing a filter functional unit shown in FIG. 13.
Figure 15A:
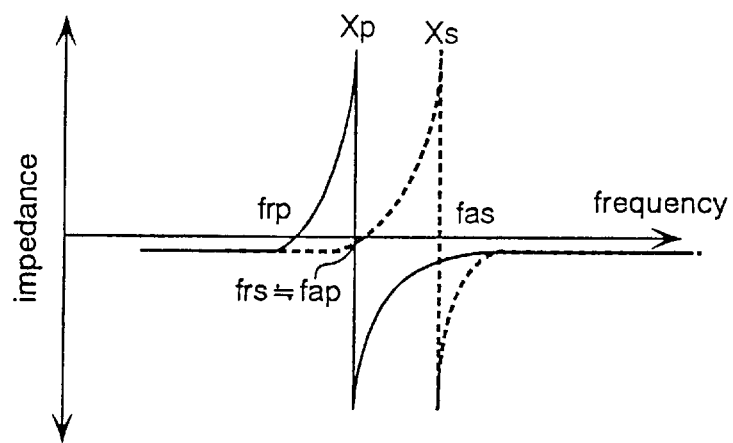
FIG. 15A is a graph showing frequency-impedance characteristics in a series arm resonator and a parallel arm resonator in the filter functional unit shown in FIG. 13.
Figure 15B:
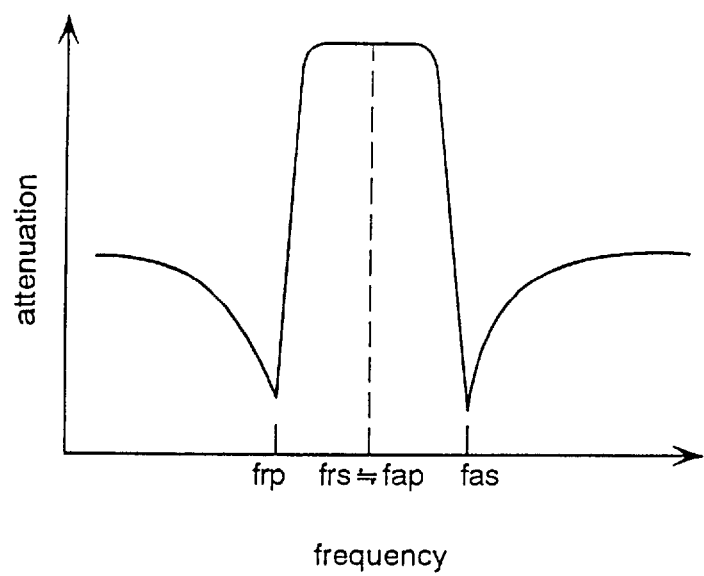
FIGS. 15B is a graph showing frequency-attenuation characteristics in a case where both the resonators shown in FIG. 15A are used.
Figure 16A:
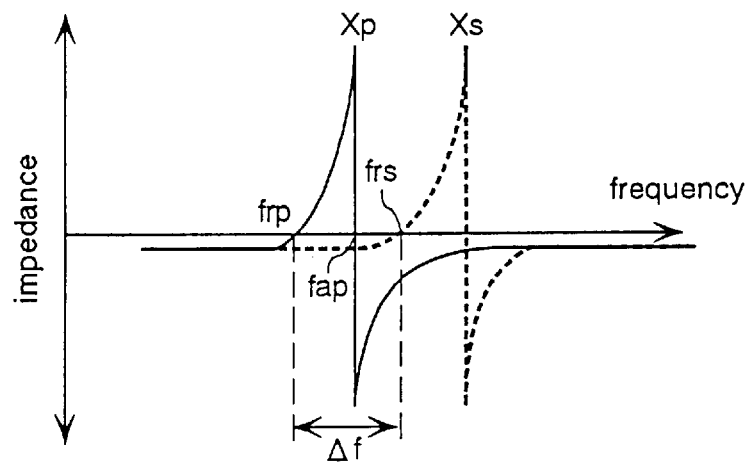
FIG. 16A is a graph showing frequency-impedance characteristics in a case where $\Delta f$ is increased in the series arm resonator and the parallel arm resonator in the filter functional unit shown in FIG. 13.
Figure 16B:
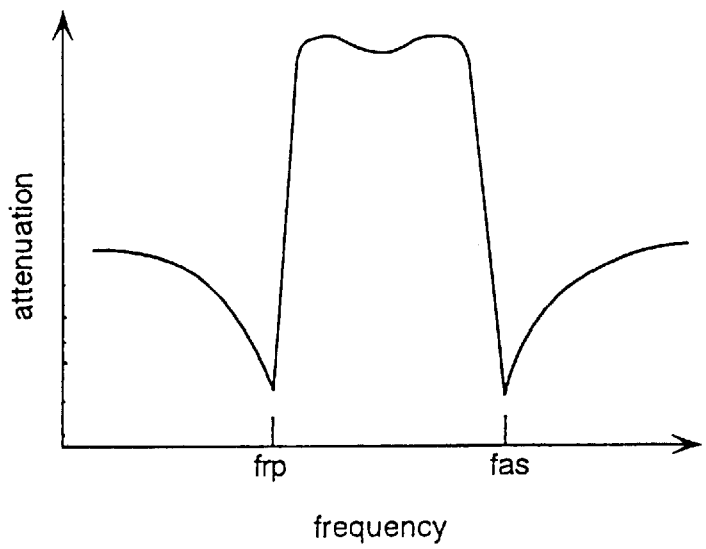
FIGS. 16B is a graph showing frequency-attenuation characteristics in a case where both the resonators shown in FIG. 16A are used.
Figure 17A:
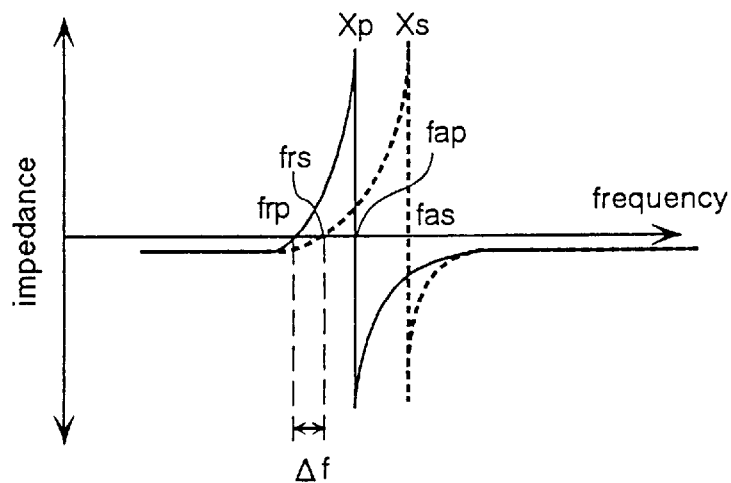
FIGS. 17A is a graph showing frequency-impedance characteristics in a case where Δf is decreased in the series arm resonator and the parallel arm resonator in the filter functional unit shown in FIG. 13.
Figure 17B:
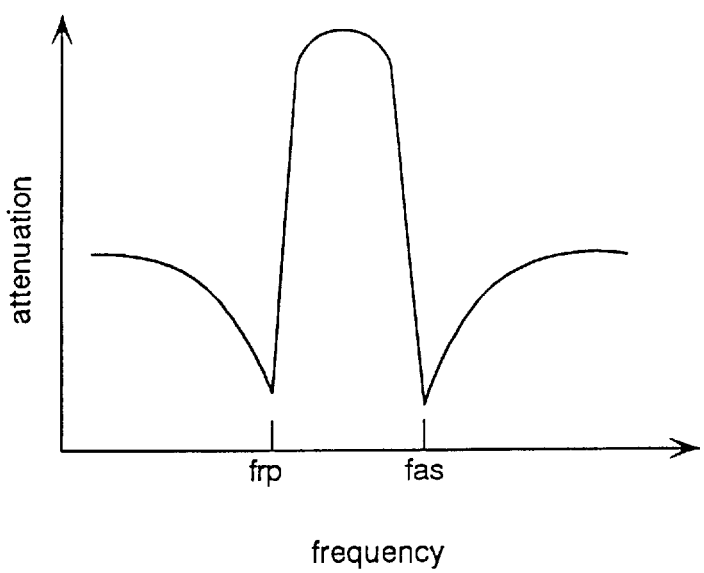
FIG. 17B is a graph showing frequency-attenuation characteristics in a case where both the resonators shown in FIG. 17A are used.
Figure 18:
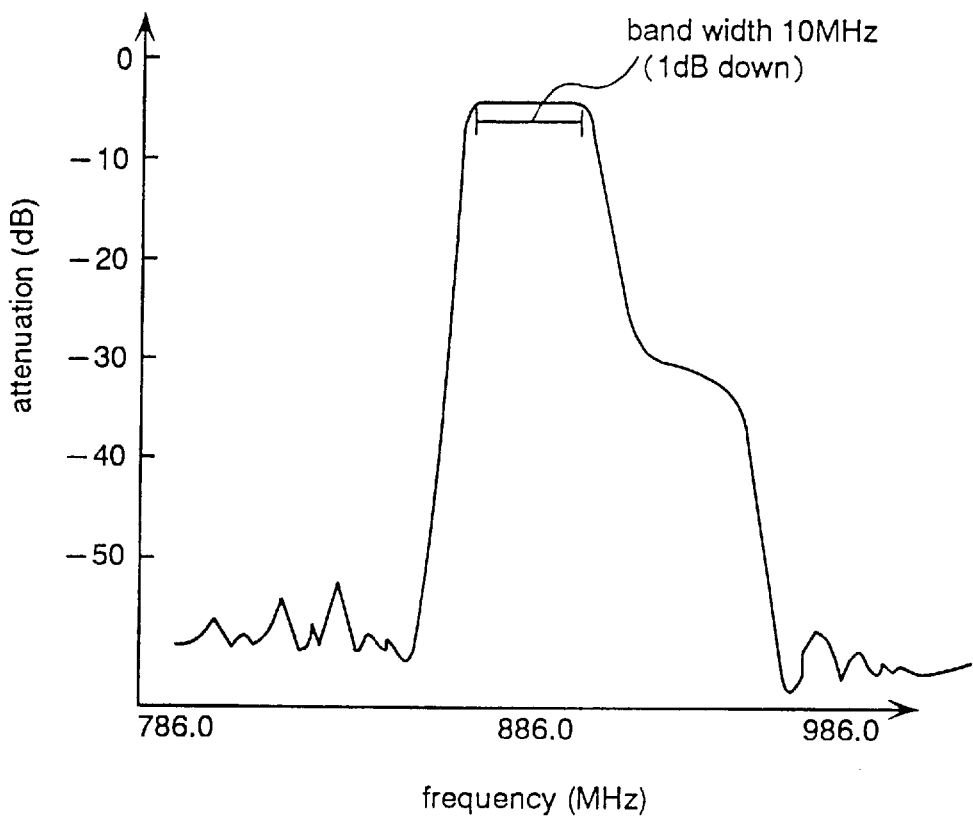
FIG. 18 is a graph showing frequency-attenuation characteristics in a conventional modecoupling type surface acoustic wave filter.

FIG. 7 is a graph showing frequency-attenuation characteristics in the surface acoustic wave filter shown in FIG. 1. For comparison, frequency-attenuation characteristics in the conventional surface acoustic wave filter shown in FIG. 13 is also shown. As is apparent from FIG. 7, in the surface acoustic wave filter according to the present invention, frequency characteristics can be set such that the passband width becomes 25 MHz. Even if the passband width is thus narrowed, it is not probable that the passband is brought into a convex shape when the difference in resonance frequencies Δf is decreased, as shown in FIG. 17 in the conventional example. Further, it is possible to solve the problem that only the change in the material of the piezoelectric substrate cannot sufficiently cope with a frequency band-width (33 MHz, 25 MHz, and 17 MHz) required in each communication method.

Although in the above-mentioned description, the respective numbers of electrode fingers in parts into which the interdigital transducer is divided by the continuously adjacent electrode fingers are made equal to each other, it goes without saying that the present invention is not limited to the same. Even when the respective numbers of electrode fingers in parts into which the interdigital transducer is divided differ from each other, the same function is permitted. Although continuously adjacent electrode fingers are formed only in the series arm resonator 2S, continuously adjacent electrode fingers may be formed only in the parallel arm resonator 2P. Alternatively, continuously adjacent electrode fingers may be formed in both the series arm resonator 2S and the parallel arm resonator 2P. Further, the composite type surface acoustic wave filter according to the present invention permits the above-mentioned function in any frequency band which is not limited to a frequency band of 800 MHz.

An interdigitated interdigital transducer type surface acoustic wave filter according to a second embodiment of the present invention will be described.

Figure 8:
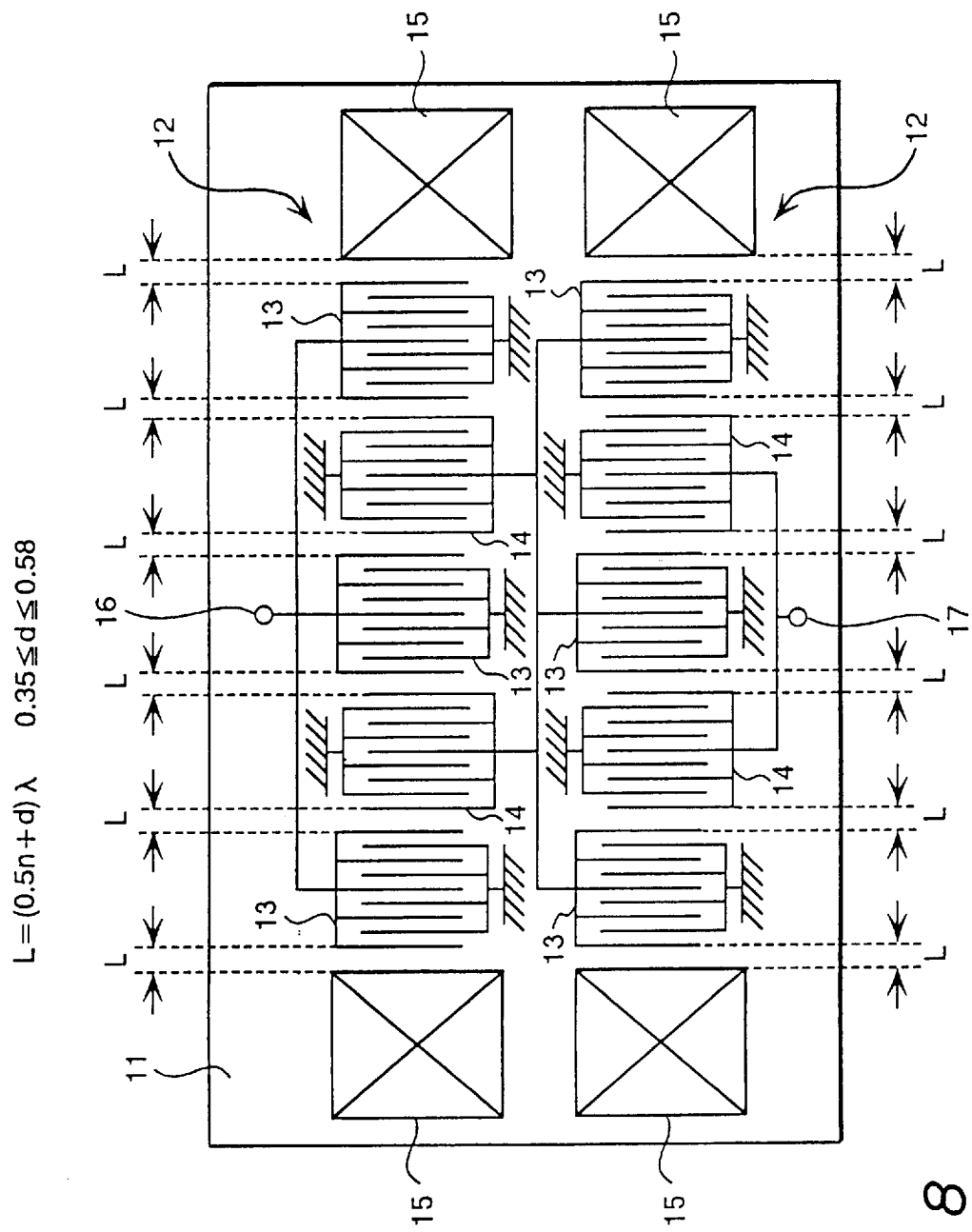
FIG. 8 is a typical plan view showing an interdigitated interdigital transducer type surface acoustic wave filter according to the present invention.

FIG. 8 is a typical enlarged plan view showing an interdigitated interdigital transducer type surface acoustic wave filter according to a second embodiment of the present invention. Two interdigitated interdigital transducer type surface acoustic wave structures 12 which differ in propagation paths are formed on a piezoelectric substrate (e.g., 36°-rotated Y-cut X-propagating $LiTaO_3$) 11. Each of the surface acoustic wave filter structures 12 is constructed by disposing interdigital transducers for input 13 and interdigital transducers for output 14 which transmit and receive a surface acoustic wave to and from each other on the same propagation path. Further, a pair of grating reflectors 15 is provided on the outermost sides so as to interpose a group of interdigital transducers for input 13 and a group of interdigital transducers for output 14 in order to reduce the insertion loss of the filter.

The interdigital transducers for input 13 in the surface acoustic wave filter structure 12 on the upper side shown in FIG. 8 are connected to a signal input section 16, and the interdigital transducers for output 14 are connected to the interdigital transducers for input 13 in the surface acoustic wave filter structure 12 on the lower side shown in FIG. 8. The interdigital transducers for output 14 in the surface acoustic wave filter structure 12 on the lower side shown in FIG. 8 are connected to a signal output section 17. That is, the surface acoustic wave filter structures 12 are adapted such that a signal outputted from the surface acoustic wave filter structure 12 on the upper side is inputted to the surface acoustic wave filter structure on the lower side, to form a serially-connected structure.

In each of the surface acoustic wave filter structures 12, the distance L between electrode fingers respectively positioned at the outermost ends of each of the interdigital transducers for input 13 and each of the interdigital transducers for output 14 which are adjacent to each other and opposite to each other is set to a value represented by $L=(0.5n+d)\lambda$ in the range of $0.35 \leq d$ (a scale factor between input and output electrodes) $\leq 0.58$, letting $\lambda$ be the wavelength of a surface acoustic wave and n be an integer. In the present embodiment, the distance between the electrode finger positioned at the outermost end of the interdigital transducer for input 13 positioned at the outermost end in each of the surface acoustic wave filter structures 12 and the grating reflector 15 is also set to the same value as the above-mentioned distance L. The interdigital transducers are subjected to such weighting of the number of pairs of electrode fingers that the number of pairs of electrode fingers of the interdigital transducer (13 or 14) positioned in the center is made greater than the number of pairs of electrode fingers of the interdigital transducer (13 or 14) positioned at an end (not illustrated).

Figure 9:
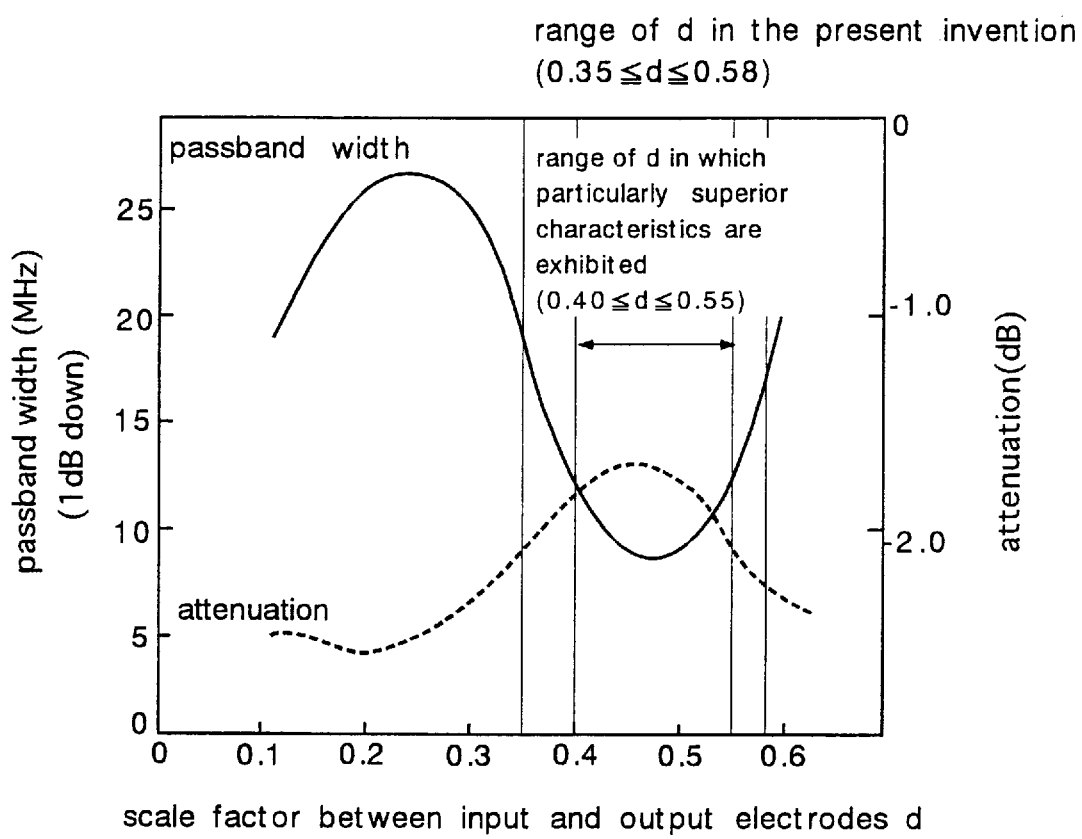
FIG. 9 is a graph showing the passband width and the attenuation of a surface acoustic wave filter with respect to a scale factor between input and output electrodes d in the present invention.

The relationship between attenuation (an insertion loss) and a passband width in one interdigitated interdigital transducer type surface acoustic wave filter structure (or one interdigitated interdigital transducer type surface acoustic wave filter) in a case where the scale factor between input and output electrodes d is changed in the range of 0.1 to 0.6 to change the distance L is illustrated in FIG. 9. As is apparent from FIG. 9, the attenuation is not more than approximately 2 dB in the range of $0.35 \leq d \leq 0.58$. On the other hand, the passband width is not more than 20 MHz in the range of $0.35 \leq d \leq 0.58$.

Figure 10:
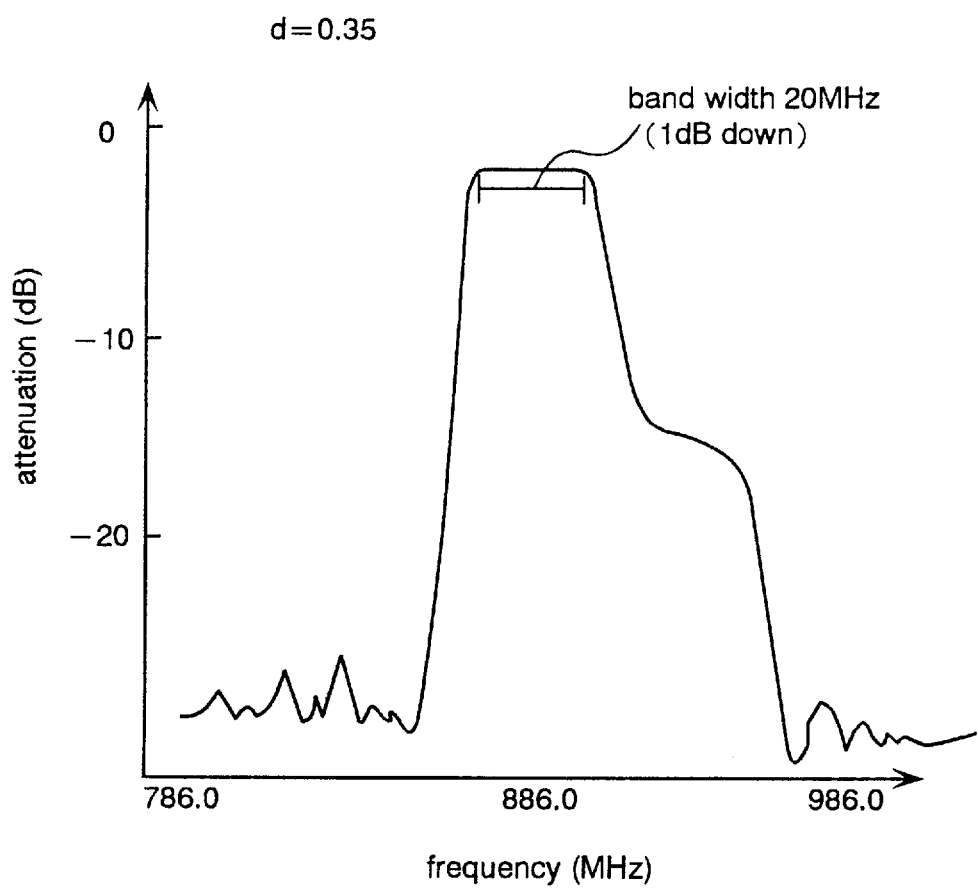
FIG. 10 is a graph showing frequency-attenuation characteristics in a surface acoustic wave filter (one surface acoustic wave filter structure) according to the present invention.

FIG. 10 is a graph showing frequency-attenuation characteristics in one interdigitated interdigital transducer type surface acoustic wave filter structure (or one interdigitated interdigital transducer type surface acoustic wave filter) in a case where d=0.35 (L=0.35 if n=1). As is apparent from FIG. 10, characteristics, i.e., an insertion loss of approximately 2 dB, and a band-width of not more than 20 MHz (1 dB down) are obtained. In addition, a value of not less than 25 dB is obtained as attenuation outside the band. Thus, the insertion loss is reduced, and the passband is narrowed. When a narrow band is required as the filter passband, and a low insertion loss is required, therefore, superior characteristics are exhibited. There is a method of increasing the number of electrode fingers in a case where the passband is decreased. In a surface acoustic wave filter having the advantage of miniaturization, however, the method is not useful. Consequently, the present invention does not involve the increase in the number of electrode fingers, whereby a low insertion loss and a narrow passband width can be realized while maintaining the advantage of miniaturization of the surface acoustic wave filter.

In frequency-attenuation characteristics in the surface acoustic wave filter of the above-mentioned construction shown in FIG. 8 (such construction that two interdigitated interdigital transducer type surface acoustic wave filter structures are connected in series) in a case where d=0.35, the band-width is approximately one-half (10 MHz or less: 1dB down), the insertion loss is approximately two times (approximately 4 dB), and the attenuation outside the band is approximately two times (approximately 50 dB), as compared with those in the above-mentioned characteristics shown in FIG. 10 (the characteristics in the construction having one interdigitated interdigital transducer type surface acoustic wave filter structure). Consequently, the passband is further narrowed, and the insertion loss is increased, as compared with those shown in FIG. 10, which is suitable for a case where a narrower band is required as the filter passband. Further, the insertion loss can be held lower, as compared with that in a case where conventional interdigitated interdigital transducer type surface acoustic wave filters are connected in series. Furthermore, greater attenuation outside the band than that in the characteristics shown in FIG. 10 is obtained.

Figure 11:
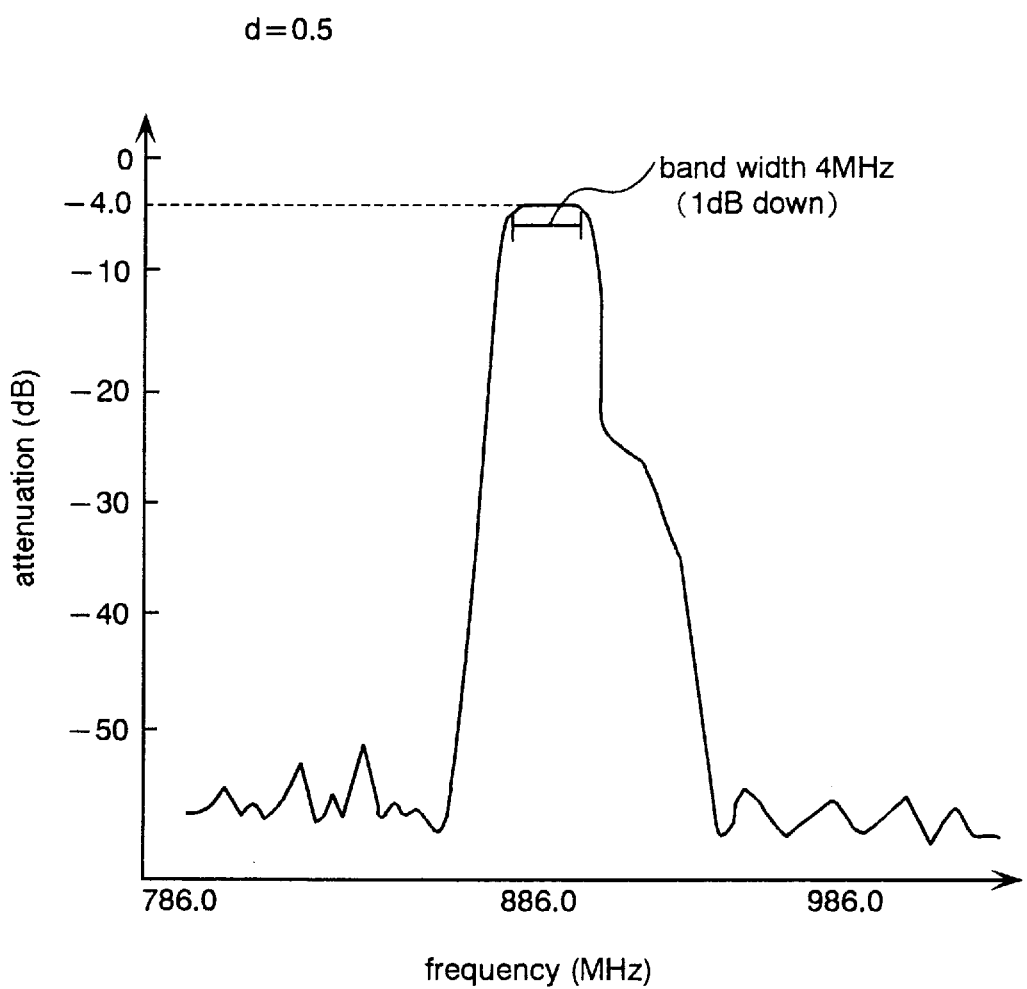
FIG. 11 is a graph showing frequency-attenuation characteristics in the surface acoustic wave filter of the construction shown in FIG. 8.

FIG. 11 is a graph showing frequency-attenuation characteristics in the surface acoustic wave filter of the above-mentioned construction shown in FIG. 8 (such construction that two interdigitated interdigital transducer type surface acoustic wave filter structures are connected in series) in a case where d=0.5 (L=0.5 if n=0). As apparent from FIG. 11, in the surface acoustic wave filter, characteristics, i.e., an insertion loss of approximately 3.5 dB, a band-width of 4 MHz (1 dB down), and attenuation outside the band of not less than 50 dB are obtained. In this case, the passband is further narrowed, as compared with that in a case where two surface acoustic wave filter structures having the characteristics shown in FIG. 10 are connected in series. When a. narrower band is required as the filter passband, and a low insertion loss and high attenuation outside the band are required, however, superior characteristics are exhibited.

Examples of a surface acoustic wave filter in which a narrow band is required as a filter passband, and a low insertion loss and high attenuation outside the band are required include a digital cordless telephone in Europe (specifications of CT-1+ and CT-2). In the digital cordless telephone, the passband width is set to $f_0\pm 2$ MHz, and the attenuation outside the band is set to 50 dB. Consequently, the interdigitated interdigital transducer type surface acoustic filter having the characteristics shown in FIG. 11 is a filter particularly suitable in the above-mentioned specifications of CT-1+ and CT-2. In the range of $0.40 \leq d \leq 0.55$, the insertion loss is further reduced, and the passband width is further narrowed, as apparent from FIG. 9. When the specifications of CT-1+ and CT-2 are considered, therefore, the range of $0.40 \leq d \leq 0.55$ is desirable.

Examples of a filter which can correspond to the above-mentioned specifications of CT-1+ and CT-2 include a mode-coupling type surface acoustic wave filter. When the mode-coupling type surface acoustic wave filter is constructed as a high-frequency filter having a frequency band of 900 MHz, 36°-rotated Y-cut X-propagating $LiTaO_3$ (electromechanical coupling factor $K^2=4.7\%$) or 64°-rotated Y-cut X-propagating $LiNbO_3$ ($K^2=11.0\%$) is used as a piezoelectric substrate. However, in the frequency-attenuation characteristics in the modecoupling type surface acoustic wave filter, the band-width is not less than 10 MHz (1 dB down), as shown in FIG. 9. Therefore, it is found that the interdigitated interdigital transducer type surface acoustic wave filter according to the present invention having the above-mentioned characteristics shown in FIG. 11 is more suitable for the above-mentioned specifications of CT-1+ and CT-2.

Figure 12:
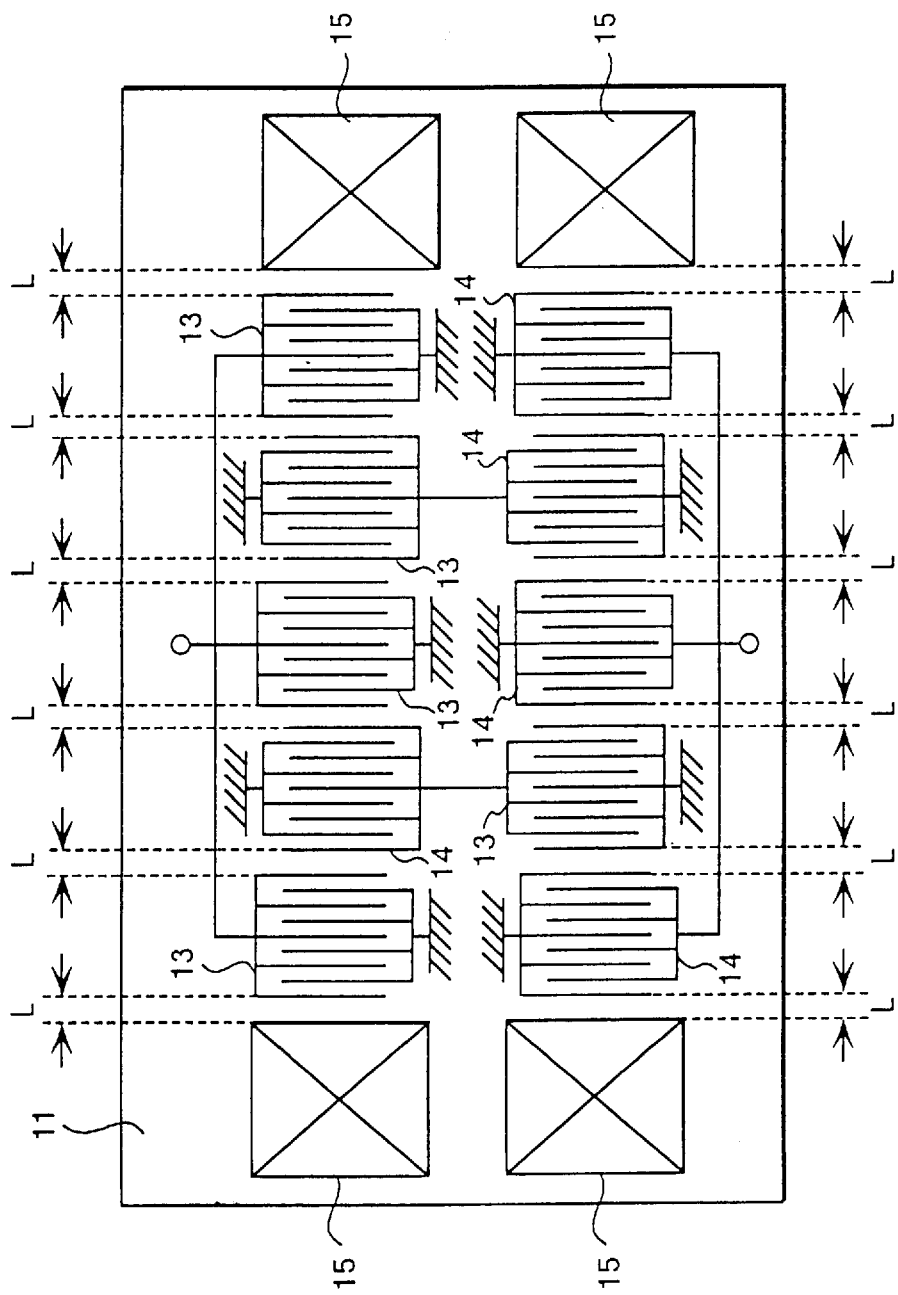
FIG. 12 is a typical plan view showing a modified example of an interdigitated interdigital transducer type surface acoustic wave filter according to the present invention.

FIG. 12 is a typical enlarged plan view showing a modified example of an interdigitated interdigital transducer type surface acoustic wave filter. The distinctions from the interdigitated interdigital transducer type surface acoustic wave filter shown in FIG. 8 are as follows. Specifically, the arrangement of the interdigital transducers for input 13 and the interdigital transducers for output 14 in the surface acoustic wave filter structure 2 in the upper stage is the same as that in the surface acoustic wave filter structure 2 in the lower stage in the surface acoustic wave filter shown in FIG. 8, while the arrangement of interdigital transducers for input 13 and interdigital transducers for output 14 in a surface acoustic wave filter structure 2 in the upper stage is inversely related to that in a surface acoustic wave filter structure 2 in the lower stage in the surface acoustic wave filter shown in FIG. 12. Consequently, it is possible to simplify a wiring structure for connecting the surface acoustic wave filter structure 2 in the upper stage and the surface acoustic wave filter structure 2 in the lower stage in series.

Also in the surface acoustic wave filter of the construction shown in FIG. 12, the distance L between electrode fingers respectively positioned at the outermost ends of each of the interdigital transducers for input 13 and each of the interdigital transducers for output 14 which are adjacent to each other and opposite each other is set to a value represented by $L=(0.5n+d)\lambda$ in the range of $0.35 \leq d \leq 0.58$, letting $\lambda$ be the wavelength of a surface acoustic wave and n be an integer. When a narrow band is required as a filter passband, and a low insertion loss is required, therefore, the surface acoustic wave filter of this construction exhibits superior characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A composite type surface acoustic wave filter comprising one or more filter functional units each comprising two resonators each formed by an interdigital transducer and grating reflectors on a piezoelectric substrate, one of the resonators being electrically connected in series with a signal line and the other resonator being electrically connected in parallel with the signal line, wherein said interdigital transducer in at least one of said resonator connected in series and said resonator connected in parallel has a plurality of interdigital electrode fingers arranged on both outer sides of one or more sets of electrode fingers continuously adjacent to one another.

2. The surface acoustic wave filter according to claim 1, wherein said continuously adjacent electrode fingers are formed only in one of two comb-shaped electrodes constituting the interdigital transducer.

3. The surface acoustic wave filter according to claim 1, wherein said continuously adjacent electrode fingers are formed in both comb-shaped electrodes forming the interdigital transducer.

4. The surface acoustic wave filter according to claim 1, wherein
said piezoelectric substrate is composed of 64°-rotated Y-cut X-propagating $LiNbO_3$.

5. The surface acoustic wave filter according to claim 1, wherein
said piezoelectric substrate is composed of 36°-rotated Y-cut X-propagating $LiTaO_3$.

* * * * *